United States Patent [19]

Bryan

[11] Patent Number: 4,989,965

[45] Date of Patent: Feb. 5, 1991

[54] COLLET MOUNTING FOR AN OPTICAL ELEMENT

[75] Inventor: Raymond G. Bryan, Reno, Nev.

[73] Assignee: Spectra-Physics, Inc., San Jose, Calif.

[21] Appl. No.: 365,576

[22] Filed: Jun. 13, 1989

[51] Int. Cl.⁵ .......................... G02B 7/18; G02B 26/08
[52] U.S. Cl. ..................................... 350/632; 350/6.5; 350/631
[58] Field of Search ......................... 350/632, 6.6, 631; 356/308

[56] References Cited

U.S. PATENT DOCUMENTS 4,070,111  1/1978  Harrick .............................. 356/308
4,655,543  4/1987  Montagu ............................ 350/6.6

Primary Examiner—Bruce Y. Arnold
Assistant Examiner—James Phan
Attorney, Agent, or Firm—Skjerven, Morrill, MacPherson, Franklin & Friel

[57] ABSTRACT

In an optical system having an optical element (such as a diffraction grating) mounted on a shaft which is to be affixed to the shaft of a driver such as a galvanometer, a collet assembly is used to couple the two shafts together so as to maintain the two shafts coaxially relative to each other.

16 Claims, 4 Drawing Sheets

COLLET MOUNTING FOR AN OPTICAL ELEMENT

BACKGROUND OF THE INVENTION

1. Field of the Invention

This invention relates to a method and device for mounting an optical element to a shaft, whereby the optical element is rotated by the shaft. Specifically, this invention relates to a collet assembly for coupling a rotating optical element and a driving shaft together coaxially.

2. Description of the Prior Art

In many applications such as scientific instruments, it is necessary to mount an optical element such as a mirror, lens, prism, or diffraction grating on a shaft. The shaft may be driven by a small electric motor, so that operation of the motor rotates the optical element. The usual purpose is to reflect, diffract or refract a beam of light in a given direction. A typical application is shown in FIG. 1A, whereby incident light beam 80 from light source 82 strikes optical element 84 (which is a mirror here). Mirror 84 reflects the light beam 80 as shown to spot A. Mirror 84 is attached as shown to the end of shaft 86. Shaft 86 may be the shaft of small electric motor 88. Small electric motor 88 may be a galvanometer, which is a special kind of motor used for positioning purposes. Thus, instead of galvanometer 88 spinning continuously as might a conventional motor, electric current is provided to galvanometer 88 causing it to assume a desired position. This current is precisely controlled by instrumentation or a computer (not shown) so as to rotate shaft 86 typically just a few degrees, so as to reposition mirror 84 to a new position as shown in FIG. 1B. In FIG. 1B, light beam 80 is reflected to spot B.

In an optical system where an optical element 84 is to be rotated by some driving component such as motor 88, the element must be affixed to the shaft of the driver. Where the driving component is to be used to give precise positioning of the driven element it is important for the axis of the driving shaft of the driving component to be coaxial (i.e., in line) with the desired axis of rotation of the optical element. Further, if the optical element is to be positioned rapidly it is important for all components of the system to be low in rotational mass moment of inertial and to be balanced, so the axis of rotation passes through the center of gravity of the rotating element.

Known coupling techniques for shafts such as collars with set screws tend to shift the axis of rotation off center with the axis of the collar and may introduce imbalance due to non-symmetric construction. A pinch boss, another known technique, will typically add too much inertia to the system and may suffer from the same off center and imbalance problems as does a collar with a set screw. Thus, the need is to have a coupling technique that contributes little to the inertia of the system, is inherently balanced by being symmetric about the axis of rotation, and will not introduce any offset in the axis of rotation between the driving and driven components.

SUMMARY OF THE INVENTION

In accordance with the present invention, a collet assembly is used to coaxially mount a rotating optical element to a driving shaft. The collet assembly may couple to the driving shaft, driven shaft, or both shafts. Even though the diameter of a shaft tends to vary somewhat due to typical manufacturing tolerances, the collet assembly is able to clamp on a shaft while maintaining both a symmetric and coaxial geometry. All components of the collet assembly are coaxial with the axis of rotation. The physical size of the collet is relatively small compared with the fasteners used in prior art methods and all components of the collet assembly are within a small radial distance of the axis of rotation, contributing to a low mass moment of inertia about this axis.

The primary object of the present invention is to couple a rotating optical element to a shaft so that the coupling has low inertia, is balanced, and will maintain the rotating optical element in its position coaxial with the shaft. A secondary object is to provide such a coupling that is relatively inexpensive to manufacture and easy to install, and yet which is readily removable and which will fit tightly on shafts having somewhat varying diameters and is especially suitable for a rotating optical element.

BRIEF DESCRIPTION OF THE DRAWINGS

Similar reference numbers in different FIGURES denote similar or identical structures.

DETAILED DESCRIPTION OF THE INVENTION

Figure 1A:
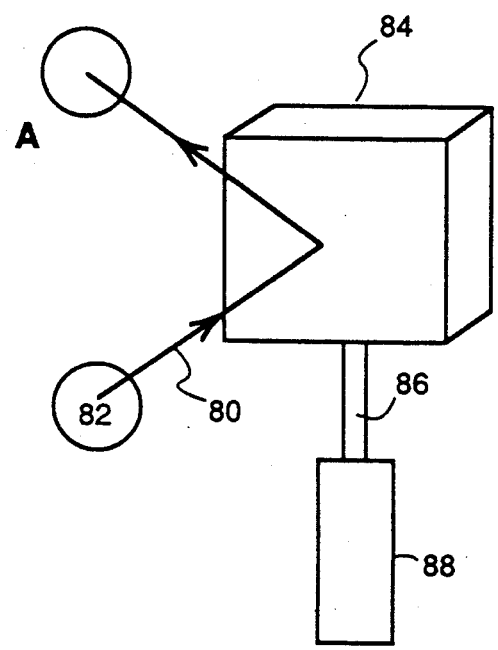
FIGS. 1A and 1B depict the prior art.
Figure 1B:
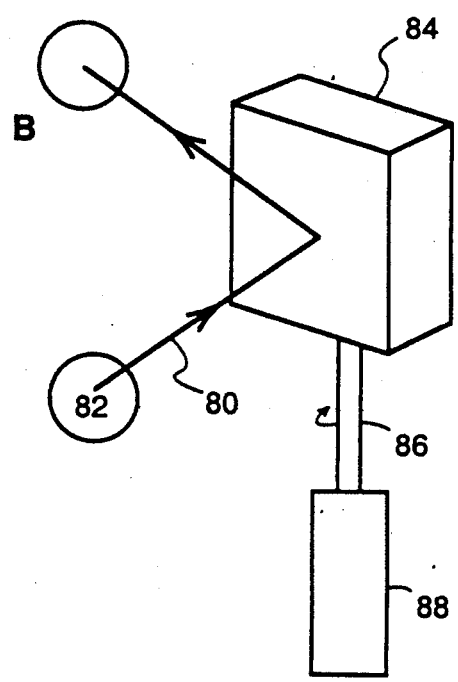
Figure 2:
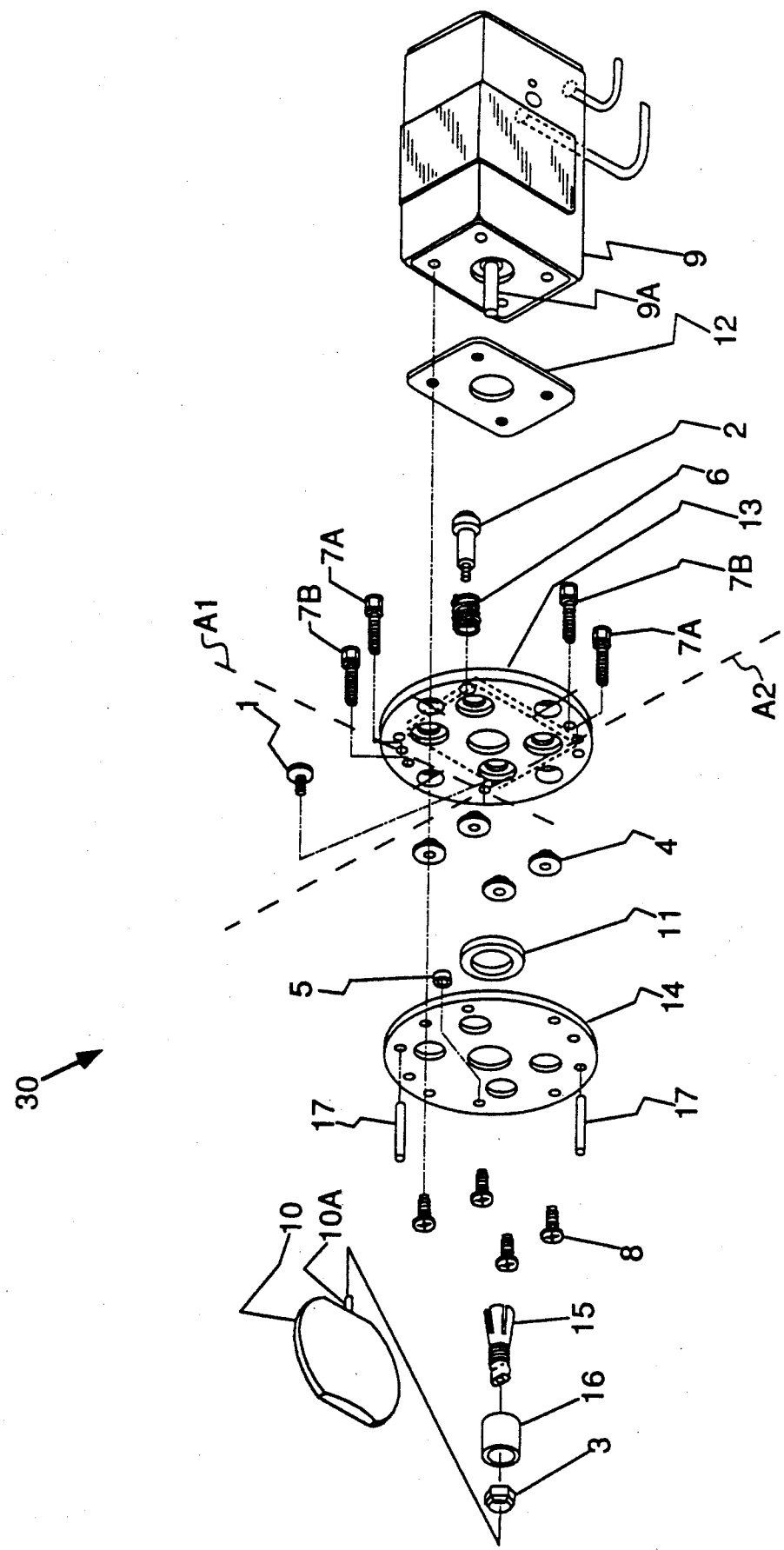
FIG. 2 depicts one embodiment of the present invention, in an exploded view.

Shown in an exploded view in FIG. 2 is a galvanometer assembly in accordance with the present invention. This assembly is similar to that disclosed in copending application, U.S. Ser. No. 07/313,683, filed Feb. 21, 1989, entitled "Galvanometer Gimbal Mount." The galvanometer 9 as described above is a special motor conventionally used to rotate the diffraction grating 10 (or other optical element). Galvanometer 9 is preferably commercially available part no. G325DT from General Scanning. The diffraction grating 10 (preferably a custom made concave grating) has a shaft 10A which is coupled to the shaft 9A of the galvanometer 9 by use of jam nut 3, collet 15, and sleeve 16 (described in more detail below). The galvanometer 9 is attached to the top plate 13 by four screws 8. Insulator 4 and insulator 12 conventionally thermally insulate the galvanometer 9 from the top plate 13. The top plate 13 is attached to the bottom plate 14 by the screw 1 and separated from bottom plate 14 by pivot spacer 5. Top plate 13 and bottom plate 14 are both preferably circular and about 2.5 inches (6.3 cm) in diameter, and both preferably are conventionally fabricated from aluminum with a black anodized finish. Top plate 13 is preferably about 0.25 inches (6.3 mm) thick; bottom plate 14 is preferably about 0.125 inches (3.1 mm) thick.

Gasket 11 is a gasket used to prevent light from entering between the top plate 13 and bottom plate 14. The top plate 13 is forced toward the bottom plate 14 opposite the pivot spacer 5 by the spring 6 and shoulder screw 2. Two adjustment screws 7A are preferably threaded through the top plate 13 and push off the bottom plate 14 in opposition to the spring 6 separating the two plates 13, 14. These two adjustment screws 7A are located midway between the pivot spacer 5 and spring 6, and on opposite sides of the galvanometer 9. Use of these two adjustment screws 7A in opposition to the spring 6 tilts the top plate 13 relative to the bottom plate 14 and allows for alignment about two axes. The two axes A1, A2 pass through the point established by the spacer 5 and screw 1, and the locations of adjustment screws 7A.

Axis A1 is the axis of rotation for optical dispersion translation, and axis A2 is the axis of rotation for optical dispersion rotation. Thus, with the bottom plate 14 mounted to the optical system the alignment can be made with respect to the optical system and the desired aiming of the spectrum achieved. Adjacent to the previously described adjustment screws 7A are two additional adjustment screws 7B which pass through the top plate 13 and thread into the bottom plate 14 to lock the alignment. The top plate 13 has a clearance hole and the bottom plate 14 is threaded. Two dowel pins 17 maintain the orientation between the top 13 and bottom plates 14. The dowel pins 17 are also used to align the galvanometer assembly 30 with the optical system.

Figure 3:
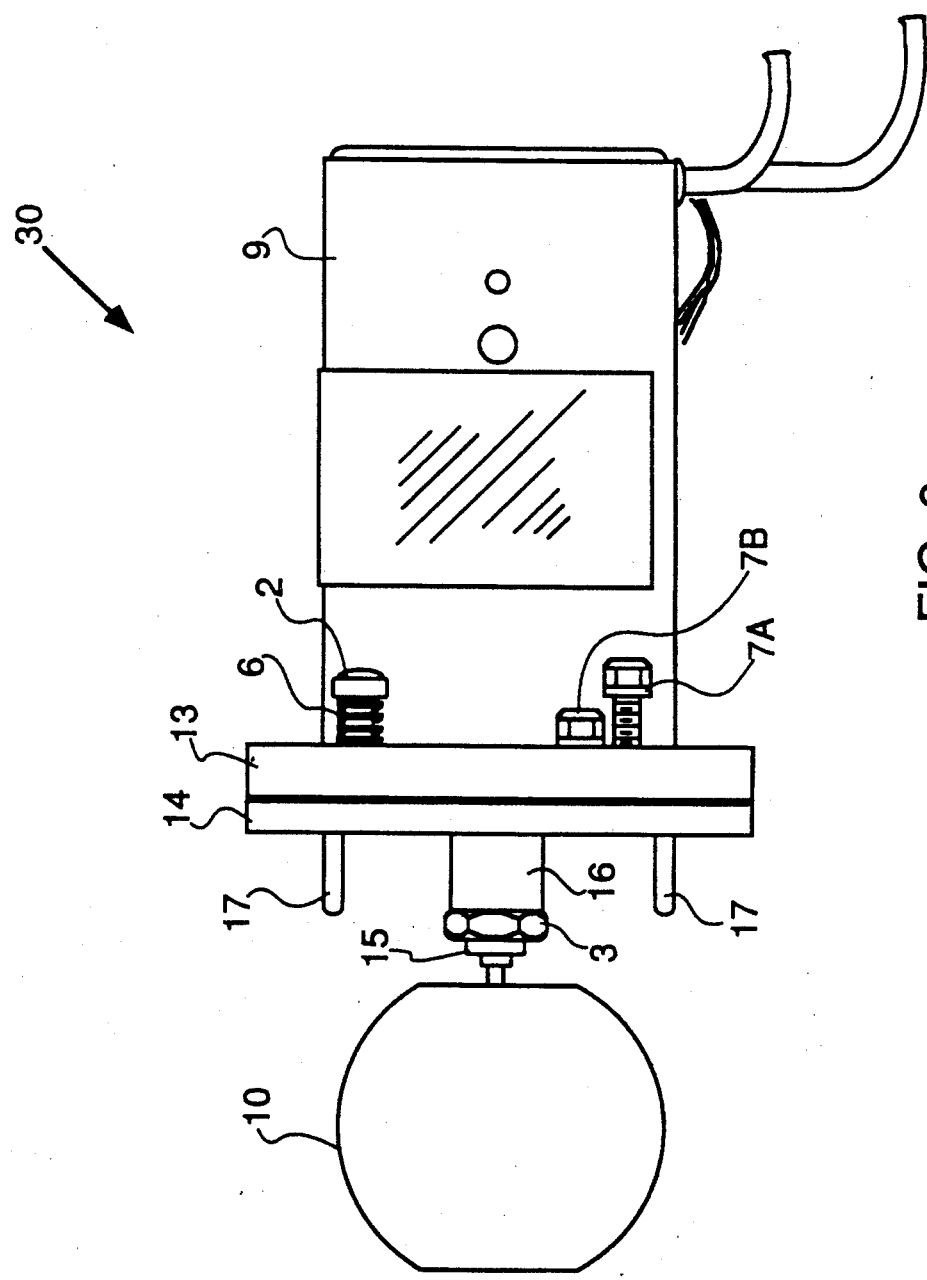
FIG. 3 depicts the embodiment of FIG. 2, in an assembled view.

FIG. 3 shows the galvanometer assembly 30 assembled, in side view. Visible are diffraction grating 10, part of collet 15, jam nut 3, sleeve 16, dowel pins 17, bottom plate 14, top plate 13, spring 6, shoulder screw 2, screw 7, and galvanometer 9.

Galvanometer 9 is thus firmly attached to top plate 13, and galvanometer 9 and top plate 13 are gimballed relative to bottom plate 14, which is attached to the framework of the optical system (i.e., a spectrophotometer instrument, not shown).

This embodiment of the invention uses a collet assembly coupled to the galvanometer driving shaft 9A. The driven component (i.e., diffraction grating 10) has shaft 10A which is permanently attached to the opposite end of the collet 15 using an anaerobic cylindrical bonding compound (i.e., an adhesive, preferably Loctite 601). The collet components are the collet 15, sleeve 16, and jam nut 3. The sleeve 16 and jam nut 3 are placed onto the collet 15 and the diffraction grating shaft 10A bonded into place on collet 15. The collet 15 is slipped onto the shaft 9A of the galvanometer 9 and the diffraction grating 10 rotated to the desired neutral orientation relative to the other components of the galvanometer assembly. As the jam nut 3 is tightened the sleeve 16 is forced up the tapered portion of the collet 15, causing a symmetric constriction of collet 15 so as to bring collet 15 into contact with the galvanometer shaft 9A, making a coaxial connection between these two components.

As described above, a similar collet assembly may be used in accordance with the invention to connect the diffraction grating 10 to the collet 15, instead of using the bonding compound. Collet 15 is shown in detail in FIG. 4A. Collet 15 is preferably machined from 303 stainless steel.

Figure 4D:
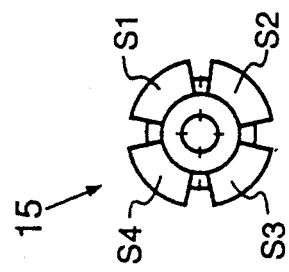
FIGS. 4C, 4D depict end views of the view of FIG. 4A.
Figure 4B:
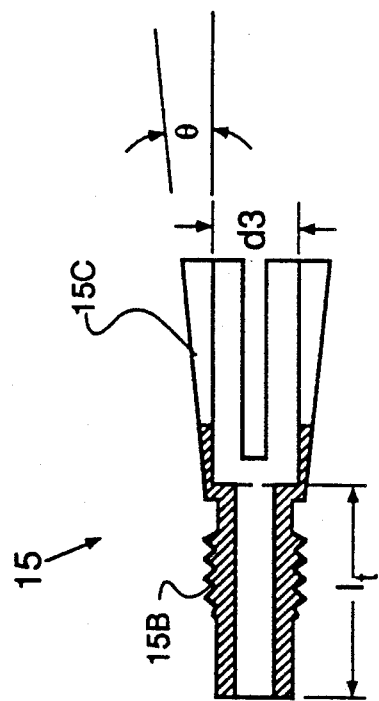
FIG. 4B depicts a cross-sectional view of the view of FIG. 4A.

The preferred dimensions of collet 15 are overall length "l" about 1 inch (2.5 cm); first outside diameter d1 about 0.32 inch (7.9 mm); second outside diameter d2 about 0.2 inch (5.1 mm). The threads on the threaded portion 15B of collet 15 are preferably ¼–28 UNF to accommodate the corresponding jam nut 3 (see FIG. 2). As shown in FIG. 4B, which is a cross sectional view of the collet 15 of FIG. 4A along line B—B, inside diameter d3, to accommodate the shaft 9A of galvanometer 9 is about 0.188 inches (4.78 mm). The threaded section 15B of collet 15 is of length $l_t$, preferably about 0.47 inches (12.1 mm). FIG. 4C shows an end view of the view of FIG. 4A along line C—C. FIG. 4D shows a second end view along line D—D of FIG. 4A. The unthreaded portion 15C of collet 15 is preferably tapered at angle $\theta$ at about 5° as shown in FIG. 4B.

Sleeve 16 (see FIG. 3) is preferably about 0.438 inches (11.1 mm) long and about 0.375 inches (9.5 mm) in outside diameter. Sleeve 16 is preferably machined from 6061-T6 aluminum, and has a wall thickness of about 0.035 inches (0.89 mm).

Jam nut 3 is a standard commercially available nut, about 0.4 inches (10 mm) in diameter so as to be larger in diameter than sleeve 16. Both sleeve 16 and nut 3 preferably have a conventional black anodized finish, to enhance optical performance of the system.

Figure 4A:
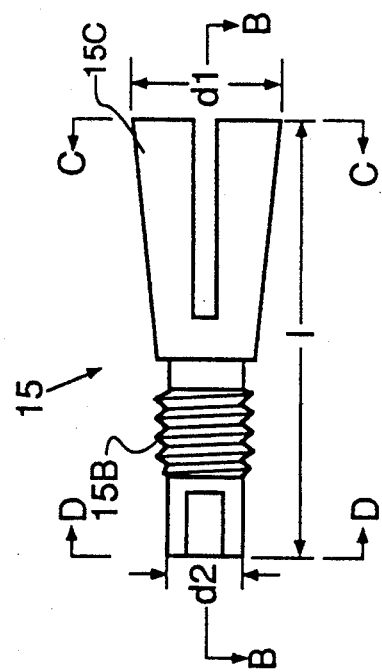
FIG. 4A depicts a view of the collet of one embodiment of the present invention.
Figure 4C:
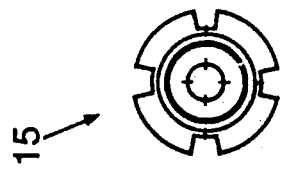

The embodiment of collet 15 shown in FIGS. 4A and 4D has four slits in its unthreaded portion 15C arranged at 90° intervals as shown in end view FIG. 4D, so as to divide the unthreaded portion 15C of collet 15 into four compressible segments S1, S2, S3, S4. Other embodiments have two slits arranged at a 180° interval, or one slit, or three slits or some other convenient number of slits; the slits are provided to allow the unthreaded portion 15C of the collet 15 to be easily and uniformly compressed together by sleeve 16.

In another embodiment, the segments S1–S4 are compressed directly by the nut, or some component that combines the functions of the nut and sleeve.

The above dimensions are convenient, and not critical to the invention.

The above description of the invention is illustrative and not limiting; other embodiments of the invention will be apparent to one skilled in the art in light of the above description.

We claim:

1. An assembly comprising:
   a rotating optical element having a shaft;
   a shaft for driving the rotating optical element;
   a collet having a first end which is compressible and a second end, the first end defining a cavity for holding the driving shaft and attaching co-axially to the driving shaft;
   compressing means co-axial with the driving shaft for compressing the first end of the collet around the driving shaft; and
   means for attaching the shaft of the rotating optical element to the collet.

2. The device of claim 1, wherein the compressing means includes a sleeve fitting over the first end of the collet, and tightening means fitting over the sleeve for tightening the sleeve onto the first end.

3. The device of claim 2, wherein the first end of the collet comprises an outer wall which is tapered so as to be of greater outside diameter at a portion closer to the first end of the collet than at a portion nearer the second end of the collet.

4. The device of claim 2, wherein the tightening means comprises:
   a nut having threads; and
   a threaded portion on the second end of the collet for accepting the threads of the nut.

5. The device of claim 1, wherein the collet assembly is symmetric about an axis defined by the driving shaft.

6. The device of claim 2, wherein the first end of the collet defines at least one slit.

7. The device of claim 2, wherein the first end of the collet defines four slits.

8. The device of claim 1, wherein the means for attaching include:
a cavity defined in the second end of the collet, the cavity holding the shaft of the rotating optical element; and
bonding means for bonding the shaft of the rotating optical element to the second end of the collet.

9. An assembly comprising:
a rotating optical element having a shaft;
a shaft for driving the rotating optical element;
a collet attaching co-axially to the shaft of the rotating optical element;
means fitting over the collet for compressing a portion of the collet around the driving shaft; and
means for attaching the driving shaft to the collet assembly.

10. A collet assembly for coupling a first shaft to a second shaft comprising:
a collet having a first end defining four slits which is compressible and a second end, the first end defining a cavity for holding the first shaft;
a sleeve fitting over the first end of the collet;
tightening means fitting over the collet for tightening the sleeve onto the first end of the collet, so as to compress the first end of the collet around the first shaft; and
means for attaching the second shaft to the second end of the collet;
wherein one of the shafts is a shaft of a rotating optical element.

11. A method for coupling a first shaft to a second shaft comprising the steps of:
providing a collet having a first end which is compressible and a second end, the first end defining cavity and comprising an outer wall tapered to be of greater outside diameter at a portion closer to the first end than at a portion nearer the second end;
inserting the first shaft in the cavity;
providing a sleeve around the first end of the collet;
tightening the sleeve onto the first end of the collet, so as to compress the first end of the collet on the first shaft; and
attaching the second shaft to the second end of the collet.

12. An assembly comprising:
a rotating optical element having a shaft;
a shaft for driving the rotating optical element;
a collet attaching co-axially to the driving shaft and having a first end which is compressible and a second end, the first end defining a cavity for holding the driving shaft;
a sleeve fitting over the first end of the collet;
means fitting over the sleeve for tightening the sleeve onto the first end and for compressing the first end around the driving shaft; and
means for attaching the shaft of the rotating optical element to the collet assembly;
wherein the first end of the collet comprises an outer wall which is tapered so as to be of greater outside diameter at a portion closer to the first end of the collet than at a portion nearer the second end of the collet.

13. An assembly comprising:
a rotating optical element having a shaft;
a shaft for driving the rotating optical element;
a collet attaching co-axially to the driving shaft and having a first end which is compressible and a second end, the first end defining a cavity for holding the driving shaft;
a sleeve fitting over the first end of the collet;
tightening means fitting over the sleeve for tightening the sleeve onto the first end and for compressing the first end of the collet around the driving shaft; and
means for attaching the shaft of the rotating optical element to the collet assembly;
wherein the tightening means comprises:
a nut having threads; and
a threaded portion on the second end of the collet for accepting the threads of the nut.

14. An assembly comprising:
a rotating optical element having a shaft;
a shaft for driving the rotating optical element;
a collet attaching co-axially to the driving shaft and having a first end defining four slits and which is compressible and a second end, the first end also defining a cavity for holding the driving shaft;
a sleeve fitting over the first end of the collet; and
means fitting over the sleeve for tightening the sleeve onto the first end and for compressing the first end of the collet around the driving shaft.

15. A method for coupling a first shaft to a second shaft comprising the steps of:
providing a collet having a first end defining four slits and which is compressible and a second end, the first end also defining a cavity;
inserting the first shaft in the cavity;
providing a sleeve around the first end of the collet;
tightening the sleeve onto the first end of the collet, so as to compress the first end of the collet on the first shaft; and
attaching the second shaft to the second end of the collet.

16. A method for coupling a first shaft to a second shaft comprising the steps of:
providing a collet having a first end which is compressible and a second end threaded on an outside portion, the first end defining a cavity;
inserting the first shaft in the cavity;
providing a sleeve around the first end of the collet;
providing a nut having threads and fitting over the threaded outside portion of the collet;
tightening the sleeve onto the first end of the collet by threading the nut onto the threaded outside portion of the collet, so as to compress the first end of the collet on the first shaft; and
attaching the second shaft to the second end of the collet.

* * * * *